(12) United States Patent  (10) Patent No.: US 8,513,810 B2
Tago                      (45) Date of Patent: Aug. 20, 2013

(54) SEMICONDUCTOR DEVICE AND METHOD OF MANUFACTURING SAME

(75) Inventor: Masamoto Tago, Tokyo (JP)

(73) Assignee: NEC Corporation, Tokyo (JP)

( * ) Notice: Subject to any disclaimer, the term of this patent is extended or adjusted under 35 U.S.C. 154(b) by 80 days.

(21) Appl. No.: 13/003,848

(22) PCT Filed: Jul. 29, 2009

(86) PCT No.: PCT/JP2009/063464
§ 371 (c)(1),
(2), (4) Date: Jan. 12, 2011

(87) PCT Pub. No.: WO2010/013728
PCT Pub. Date: Feb. 4, 2010

(65) Prior Publication Data
US 2011/0115092 A1    May 19, 2011

(30) Foreign Application Priority Data

Jul. 31, 2008  (JP) .................................. 2008-198052

(51) Int. Cl.
*H01L 23/48*   (2006.01)
*H01L 21/44*   (2006.01)

(52) U.S. Cl.
USPC  257/762; 257/737; 257/E23.04; 257/E21.511; 438/108; 438/455; 438/617

(58) Field of Classification Search
USPC .................... 257/789–793, E23.04, E21.503, 257/E21.511, 737, 777–785, 734, 750, 762, 257/E21.088; 438/108, 455, 617, 118; 228/120, 180.1
See application file for complete search history.

(56) References Cited

U.S. PATENT DOCUMENTS

| 4,818,728 | A  | * | 4/1989  | Rai et al. ........................ | 438/108 |
| 6,184,577 | B1 | * | 2/2001  | Takemura et al. ............. | 257/701 |
| 6,406,942 | B2 | * | 6/2002  | Honda ........................... | 438/119 |
| 6,962,835 | B2 | * | 11/2005 | Tong et al. ..................... | 438/108 |
| 7,402,461 | B2 | * | 7/2008  | Mizukoshi et al. ........... | 438/108 |
| 2003/0087475 | A1 | * | 5/2003 | Sterrett et al. ................ | 438/108 |
| 2003/0207489 | A1 | * | 11/2003 | Lee .............................. | 438/106 |
| 2007/0102827 | A1 | * | 5/2007 | Hogerton et al. ............. | 257/778 |
| 2009/0102064 | A1 | * | 4/2009 | Sawada et al. ............... | 257/778 |

FOREIGN PATENT DOCUMENTS

| JP | 4-37148      | A | 2/1992  |
| JP | 2000299379   | A | 10/2000 |
| JP | 2005012008   | A | 1/2005  |
| JP | 4095049      | B | 6/2006  |
| JP | 2006261510   | A | 9/2006  |
| JP | 2008084951   | A | 4/2008  |

OTHER PUBLICATIONS

International Search Report for PCT/JP2009/063464 mailed Oct. 6, 2009.

* cited by examiner

*Primary Examiner* — Jasmine Clark

(57) ABSTRACT

There is provided a semiconductor device and a manufacturing method therefor, the semiconductor device requiring flip-chip mounting of a fine pitch electrode, wherein the fine electrode is easily manufactured, resin sealing is not required, and reliability can be improved. In the semiconductor device, one or more LSI chips (1), having an insulating layer (3) surface and an electrode (2) surface on one side, and a substrate (4), having an insulating layer (6) surface and an electrode (5) surface on one side, are bonded by having surfaces of the electrodes and surfaces of the insulating layers face each other via a bonding layer (7) made in a thin film form, in a region excluding the surfaces of the electrodes (2, 5) and the surfaces of the insulating layers (3, 6) in areas surrounding the electrodes.

15 Claims, 10 Drawing Sheets

1,2 SEMICONDUCTOR SUBSTRATE  5,6 THROUGH HOLE WIRING
7,8,11 INSULATING LAYER  9,10 GROUND WIRING LAYER
12,13 INSULATING MATERIAL  20 POWER SUPPLY WIRING LAYER

1  SEMICONDUCTOR CHIP
10 Si SUBSTRATE
11 ELECTRODE
13 FRAME STRUCTURE
16 WIRING LAYER
17 INSULATING LAYER
18 GROUND WIRING LAYER
2  INTERPOSER
20 Si SUBSTRATE
21 ELECTRODE

SEMICONDUCTOR DEVICE AND METHOD OF MANUFACTURING SAME

REFERENCE TO RELATED APPLICATION

This application is the National Phase of PCT/JP2009/063464, filed Jul. 29, 2009, which is based upon and claims the benefit of the priority of Japanese patent application No. 2008-198052, filed on Jul. 31, 2008, the disclosure of which is incorporated herein in its entirety by reference thereto.

TECHNICAL FIELD

The present invention relates to a semiconductor device and a method of manufacturing the same, and in particular to a semiconductor device manufactured by flip-chip mounting without using a sealing resin, and a method of manufacturing the same.

BACKGROUND

In recent years, from the demand for small sized, thin and high performance electronic devices, many flip-chip mounted semiconductor devices are being implemented. In a flip-chip mounting, metallic protrusions referred to as bumps of solder, Au, or the like, formed on an electrode of an LSI chip, and electrodes of a substrate are bonded by heating and/or pressurizing, and with an object of improving mechanical strength and protecting from moisture, a gap between the LSI chip and the substrate is sealed by resin. Furthermore, as a process that does not require the application of heat or pressure, technology is being developed, which is referred to as normal temperature bonding or surface activated bonding, and in which the electrode surface, after being flattened, is cleaned by an Ar atom beam or the like, and bonding is performed.

As a patent document disclosing these, Patent Document 1 discloses technology of mounting without imposing a temperature or load in a bonding process, and not requiring sealing by resin (FIG. 9). Furthermore, Patent Document 2 discloses technology, with regard to electromagnetic noise cited as a problem when performing flip-chip mounting, of forming a ground layer on a flat surface the same as an electrode surface, and bonding together with an electrode joint (FIG. 10).

[Patent Document 1]
JP Patent No. 4095049
[Patent Document 2]
JP Patent Kokai Publication No. JP-P2000-299379A

SUMMARY

The entire disclosures of Patent Documents 1 and 2 are incorporated herein by reference thereto. The following analysis is given by the present invention. There are several problems, however, with the semiconductor devices disclosed in these patent documents. A first problem is that in a case of miniaturizing bump forms and using miniaturized bumps, a resin sealing process becomes difficult. A reason for this is the point that bump formation by a plating method appropriate to miniaturization uses a photolithography technique. In order to form a micro opening part, thickness of a resist must be thin, but if the resist is thin, bump height becomes low, resin filling cannot be done by resin sealing in a subsequent process, and voids occur.

A second problem that is cited is that in a case where bumps are simply scaled down to be miniaturized, connection of bumps is difficult. In a case of solder bumps, the occurrence rate of shorts among adjacent bumps becomes high. In addition, a large load has to be applied when Au bumps are connected, and connection defects due to deformation, shorts among adjacent bumps and the like occur. With Cu bumps, the deformation amount is small, but there is surface oxidation, and a large amount of energy, such as pressurization and heating, is necessary for connecting, so that there are problems in production, such as pre-processing, device management, and the like.

In a case of Cu bumps, with regard to these problems there is a means of cleaning, by an Ar atom beam or the like, after flattening an electrode surface, and vacuum bonding, referred to as normal temperature bonding or surface activated bonding, but insulating layers outside of the bumps cannot be connected, and there are no gaps for resin sealing due to flattening. With regard to this problem, a method of forming a sealing rim of metal is disclosed, but since connection area is small and gaps are large, there is a problem with respect to reliability. Furthermore, there is a technique of forming a ground layer on a chip surface, and bonding after flattening together with an electrode, but when flattening, if the metal area is large, it is not possible to polish. If the metal area is reduced on this account, the portion of insulating layer that is not bonded increases and reliability decreases.

It is an object of the present invention to provide a semiconductor device in which an improvement in productivity and an improvement in reliability are possible, by bonding LSI chip and substrate insulating layers without using sealing resin and enabling implementation of electrode bonding and sealing together, and to provide a method of manufacturing the same.

In a first aspect, a semiconductor device according to the present invention is characterized in that at least one LSI chip having an insulating layer surface and an electrode surface on one side and a substrate having an insulating layer surface and an electrode surface on one side are bonded by having the electrode surfaces and the insulating layer surfaces face each other, via a bonding layer made in a thin film form in a region excepting the respective electrode surfaces and insulating layer surfaces in a surrounding area of the electrodes.

In a second aspect, a method of manufacturing a semiconductor device according to the present invention is characterized by having: a step of flattening an electrode and an insulating layer of each of an LSI chip and a substrate, a step of disposing a catalyst in order to form an electroless plating on a surface of the flattened electrode and insulating layer, a step of removing only the catalyst disposed on the electrode and the insulating layer surface in a surrounding area of the electrode, a step of forming a bonding layer of a thin film form on the insulating layer surface and the electrode by the electroless plating, and a step of arranging the position of the electrode of each of the LSI chip and the substrate and heating and pressurizing.

In a third aspect, a method of manufacturing a semiconductor device according to the present invention is characterized by having: a step of flattening an electrode and an insulating layer of each of an LSI chip and a substrate, a step of disposing a catalyst in order to form an electroless plating on a surface of the flattened electrode and insulating layer, a step of removing only the catalyst disposed on the electrode and the insulating layer surface in a surrounding area of the electrode, a step of forming a bonding layer of a thin film form on the insulating layer surface by the electroless plating, and a step of arranging the position of the electrode of each of the LSI chip and the substrate and heating and pressurizing.

By a structure of a semiconductor device according to the present invention, it is possible to eliminate a resin sealing step without a step being added, since bonding of insulating layers (and electrodes) that can handle a fine pitch is implemented all together. As a result, it is possible to provide a semiconductor device and a semiconductor device manufacturing method that have high productivity with high reliability and low cost. Furthermore, since a bonding layer formed on the whole surface of an LSI chip contributes greatly to bonding strength, in comparison to a case of metallic bonding of electrodes only and sealing by resin is performed, strength is dramatically improved and reliability is increased.

EXPLANATION OF SYMBOLS

Figure 1:
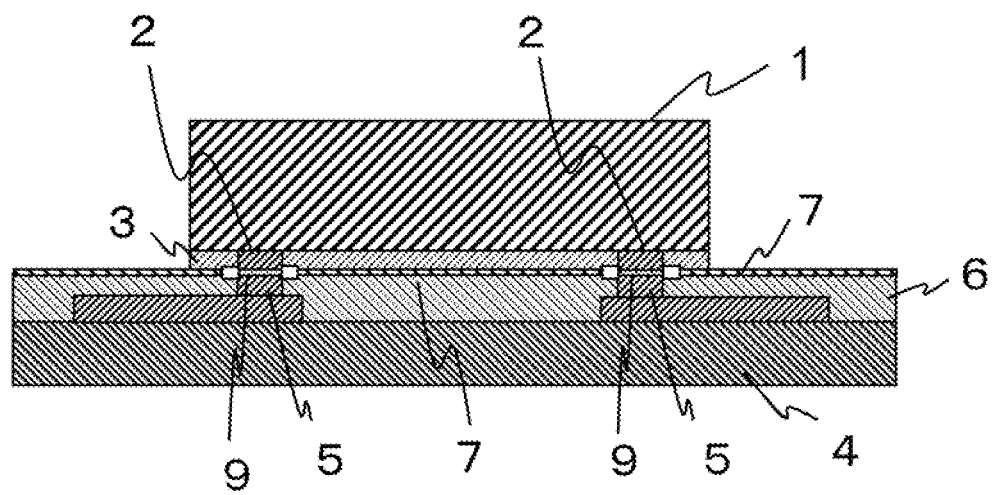
FIG. 1 is cross section structural drawing of a semiconductor device according to a first exemplary embodiment of the present invention.

1 LSI chip
2 LSI chip electrode
3 LSI chip insulating layer
4 substrate
5 substrate electrode
6 insulating layer of substrate
7 bonding layer
7a bonding layer formed on an insulating layer of an LSI chip
7b bonding layer formed on an insulating layer of a substrate
7c bonding layer formed on an electrode of an LSI chip
7d bonding layer formed on an electrode of a substrate
8 reinforcing resin
9 bonding part with electrode metal and Au Preferred Modes It is possible to form a bonding layer of a thin film form on bonding surfaces of the electrode surfaces.

The bonding layer can have any form but is preferably a thin film form of bonding layer formed on a single flat surface, that is, on one plane surface.

The bonding layer can be a metal bonding layer including at least any one of the elements, Cu, Ni, Pd, Sn, Au, and In, or a combination of a plurality thereof.

The bonding layer preferably has a thickness of at least 0.05 μm and at most 3 μm. In this way, an electromagnetic shield effect possessed by the bonding layer is further increased, noise radiated from wiring of a substrate or an LSI chip can be inhibited, and high speed operation is possible.

A space may be formed in an insulating layer portion in a surrounding area of the electrode of the LSI chip and an insulating layer portion in a surrounding area of the electrode of the substrate.

A resin that is the same or is different from insulating resin of the LSI chip or the substrate may be filled in an insulating layer portion in the area surrounding the electrode of the LSI chip and an insulating layer portion in the area surrounding the electrode of the substrate. In this way, although sealing has heretofore been performed by a resin having, in combination, a sealing property, a flow property, a linear coefficient of expansion for absorbing thermal expansion difference of the LSI chip and substrate, and a coefficient of elasticity, it is possible to provide a semiconductor device and a semiconductor device method of manufacturing in which a supply of resin material specially for improving the strength of the bonding part in the area surrounding the electrode is possible, and reliability of the bonding part can be significantly improved.

The insulating layer of the LSI chip or the substrate can be formed from an organic film, and in particular can be made of at least one of polyimide, modified polyimide, and epoxy.

The insulating layer of the LSI chip or the substrate can be formed from an inorganic film, and in particular can be made of at least one of silicon oxide film and silicon nitride film.

The bonding layer may be of a structure partially having openings or a net form.

Furthermore, in the method of manufacturing the semiconductor device, it is possible to have a step in which surface reformation is performed on an upper surface of the flattened insulating layer and electrode, before the catalyst deposition step in order to form the electroless plating.

In the method of manufacturing the semiconductor device in the present invention, a surface is flattened such that a bonding layer formed on the whole surface of the LSI chip, combining sealing and bonding of fine electrodes, can be bonded assuredly with a lower load. A flattening step flattens the electrodes and the insulating layer at the same time. Since it is not possible to directly bond insulating layers in this flattened-only state, mounting is not possible.

Consequently, the catalyst is disposed in order to form the electroless plating on the whole LSI chip surface. Normally, the electroless plating is grown only on the electrodes by a process of removing the catalyst on the insulating layer by carrying out a cleaning step thereafter, but the present invention provides a step of drying after disposing the catalyst, and catalyst removal for the electrodes, the area surrounding the electrode, or both, and it is possible to grow the electroless plating on the insulating layer.

A difference occurs in the height of the bonding layers of the flattened electrode and the insulating layer, but since the thickness of the plating that is grown is extremely thin, bonding that absorbs this thickness by an appropriate load is possible. In particular, in a case where the insulating layer is an organic film, the organic film itself deforms easily and bonding is easy.

In a case where the insulating layer is an inorganic film, and in a case where, even with an organic film, with a dishing phenomenon when flattening, the difference in height of the insulating layer and the electrode is large, it is necessary to control this process, and in particular in a case of using CMP (Chemical Mechanical Polishing) it is effective to inhibit a chemical component contributing to electrode polishing, to polish the insulating layer mechanically, and to have the height of the electrode high. Conversely, in a combination of electrode material and insulating material such that electrode polishing progresses, it is desirable to make the insulating layer low by an elective etching method such as ion etching after the flattening step.

In this way, after obtaining a structure in which the bonding layer is formed on the whole mounted surface of the LSI chip and insulated from the electrode, positioning is arranged with the substrate on which flattening is performed and the bonding layer is formed in the same way, and it is possible to bond the whole surface by heating and/or pressurizing. As a characteristic, a means is provided to simply form the bonding layer in order to mount together the insulating layer for which bonding is normally impossible with the electrode, and mounting is performed. The greatest characteristic of the present invention is of forming an extremely thin bonding layer after flattening the insulating layer and the electrode, while maintaining insulation from the electrode in a small number of steps.

Exemplary Embodiments

Next, a detailed description is given concerning exemplary embodiments of the present invention, making reference to the drawings.

First Exemplary Embodiment

FIG. 1 is a cross section drawing of a semiconductor device according to a first exemplary embodiment of the present invention. FIGS. 6A-6D show a method of manufacturing the semiconductor device according to the first exemplary embodiment of the present invention. As shown in FIG. 1, an insulating layer 3 of an LSI chip 1 and an insulating layer 6 of a substrate 4, with the exception of the area surrounding electrodes, are bonded via a bonding layer 7, and electrodes 2 of the LSI chip 1 and electrodes 5 of the substrate 4 are bonded via bonding parts 9.

The bonding layer 7 is formed to be extremely thin with the exception of each of the electrodes 2 and 5 and areas surrounding the electrodes 2 and 5, to maintain a prescribed distance so that the two electrodes 2 and 5 do not short. The bonding layer 7 has a structure in which a bonding layer 7a formed on the insulating layer 3 of the LSI chip 1, and a bonding layer 7b formed on the insulating layer 6 of the substrate 4 are respectively bonded. Furthermore, the bonding parts 9 of the two electrodes 2 and 5 form Cu diffusion bonding of electrode surfaces with Au as a diffusion agent.

Figure 6A:
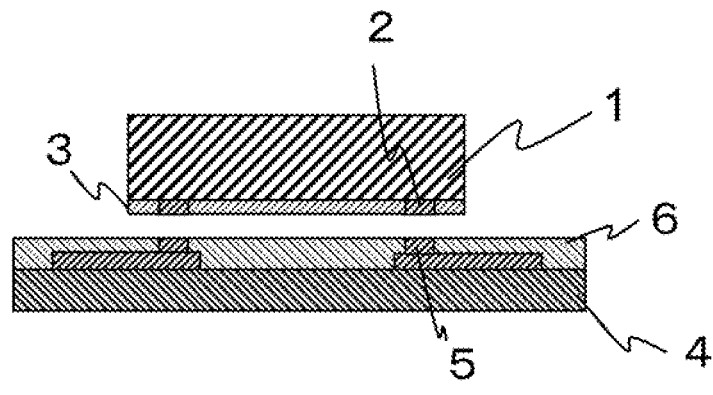
FIGS. 6A-6D are schematic drawings showing a method of manufacturing the semiconductor device according to the first exemplary embodiment of the present invention.

The method of manufacturing the semiconductor device shown in FIG. 1 is described in detail according to FIGS. 6A-6D. In the present exemplary embodiment, the surfaces of the two electrodes 2 and 5 are respectively formed by Cu plating. The insulating layers 3 and 6 of the LSI chip and the substrate 4 are respectively formed using polyimide. As shown in FIG. 6A, first the electrodes and insulating layer surfaces of the LSI chip 1 and the substrate 4 are respectively worked so as to be flat on the same plane by CMP.

Figure 6B:
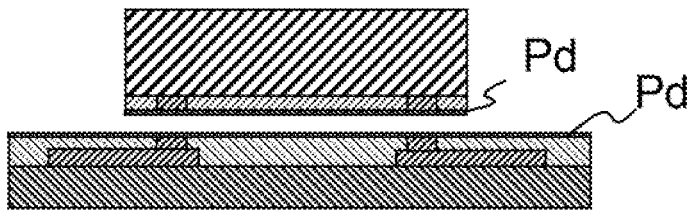

Next the bonding layer 7 and the bonding parts 9 are formed, with electroless plating being used in the present exemplary embodiment. First, as shown in FIG. 6B, Pd forming a catalyst used in the electroless plating is provided to the whole face of the flat surfaces of the electrodes and the insulating layers of each of the LSI chip 1 and the substrate 4. Thereafter, laser radiation is carried out, removing the catalyst Pd attached to the surfaces of the two electrodes 2 and 5 and the insulating layer surfaces in the surrounding areas of the two electrodes 2 and 5. The electrodes themselves are not processed by laser radiation, but with regard to the insulating layers 3 and 6 in the surrounding areas of the electrodes 2 and 5, indentations are formed for process removing together with the Pd of the catalyst by the laser radiation, and voids are formed after mounting without contributing to the bonding.

Figure 6C:
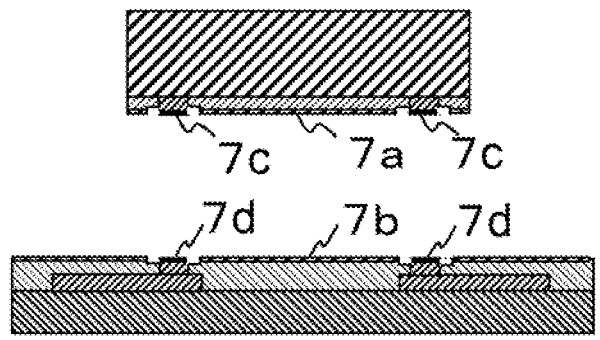
Figure 6D:
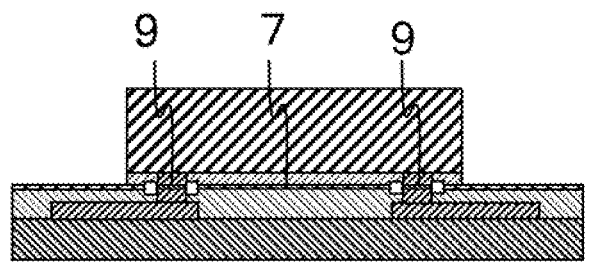
Figure 7A:
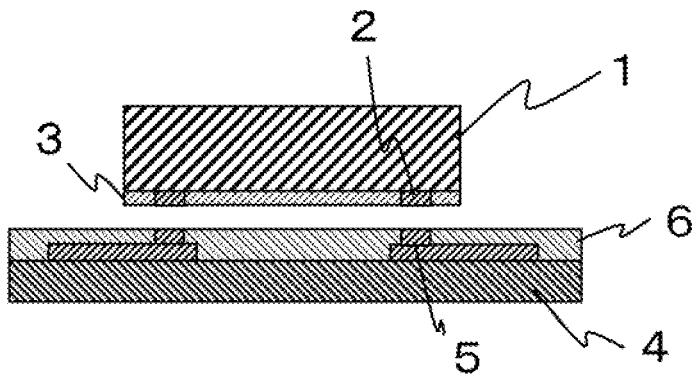
FIGS. 7A-7D are schematic drawings showing a method of manufacturing the semiconductor device according to the second exemplary embodiment of the present invention.
Figure 7B:
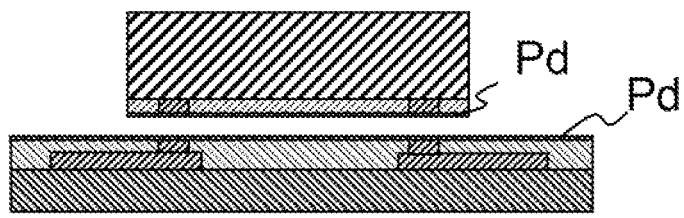
Figure 7C:
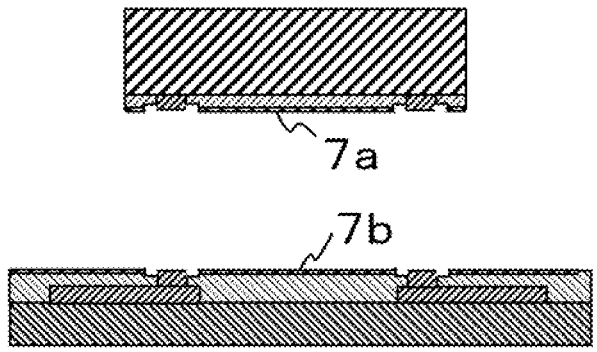
Figure 7D:
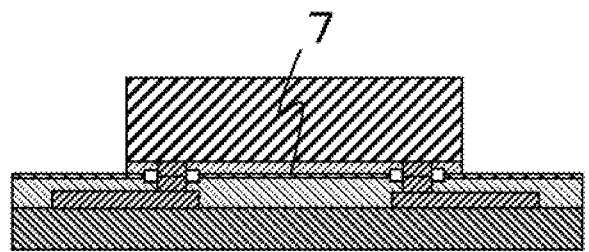

Thereafter, electroless Cu plating processing is performed, and Cu is precipitated on the surfaces of the insulating layers 3 and 6 to which the Pd is attached. An Au layer for increasing bonding capability and preventing surface oxidation is obtained by further precipitation by electroless plating on the surfaces of the electrodes 2 and 5 and the surfaces of the insulating layers 3 and 6 with the exception of the areas surrounding the electrodes 2 and 5, and formation of the bonding layers 7a to 7d is completed (FIG. 6C). The LSI chip 1 and the substrate 4 processed in this way are heated and pressurized with positions of each of the electrodes 2 and 5 arranged to be opposing and in contact. In this way, bonding layers 7c and 7d formed with electrode Cu and plating Au, formed respectively on each of the electrodes 2 and 5, are bonded to form the bonding parts 9, and the bonding layers 7a and 7b respectively formed on the insulating layers 3 and 6 are bonded to form the bonding layer 7. A bonding embodiment of these forms Cu diffusion bonding with Au as a diffusion medium (FIG. 6D).

Second Exemplary Embodiment

Figure 2:
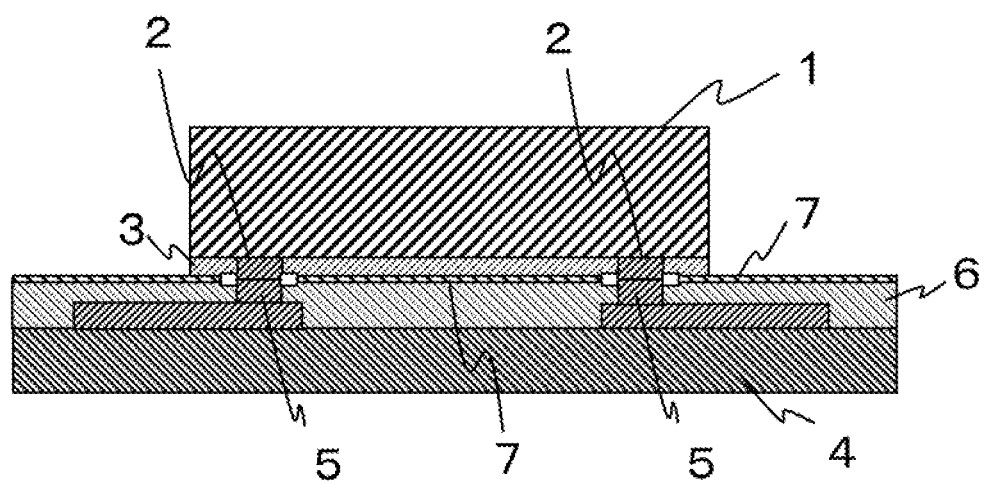
FIG. 2 is a cross section structural drawing of the semiconductor device according to a second exemplary embodiment of the present invention.

Here, as a bonding layer 7, Cu and Au are precipitated by electroless plating, but bonding by Cu only is also possible. FIG. 2 shows a cross section structural drawing of a semiconductor device according to a second exemplary embodiment of the present invention. Plating of Cu only is performed on insulating layers 3 and 6 of an LSI chip 1 and a substrate 4 and these Cu parts are directly bonded. Furthermore, in bonding of electrodes 2 and 5, since Au is not used as plating, Cu parts, which are metal on electrode surfaces, are directly bonded.

FIGS. 7A-7D show manufacturing processes thereof. With the exception of the point of bonding without Au plating, basically this is the same as a manufacturing process shown in FIGS. 6A-6D. In this case, bonding the Cu parts uses Cu diffusion bonding with a high heating temperature or surface activated bonding in which adhering is performed in a vacuum after cleaning a surface by an Ar atom beam or the like.

Third Exemplary Embodiment

In the first exemplary embodiment, Sn or In may be used instead of Au. However, in this case, where Sn or In is used in substituted plating, it is necessary to thicken Cu film thickness. Structure and method of manufacturing are not shown in the drawing, but with the exception of the fact that Sn or In are used instead of Au, basically the embodiment is the same as in FIG. 1 and FIGS. 6A-6D.

In addition, besides Cu, Au, Sn, and In, an implementation may be made by combining an electroless Ni plating and an electroless Au plating. For example, in a case of using Ni, since a catalyst on electrodes 2 and 5 is removed, Ni that is a bonding layer 7 is not grown on electrodes 2 and 5 but is grown only on insulating layers 3 and 6. Thereafter, since Au for oxidation resistance is formed, bonding of the electrodes 2 and 5 relates to bonding parts 9 of electrode metal Cu via the Au, and the bonding layer 7 relates to bonding of NiAu parts. The above illustrates an exemplary embodiment in which, in a case of using a material that can be precipitated on an electrode without requiring a catalyst, by a property of a selected electroless plating, bonding structure of the bonding layer 7 and the electrodes 2 and 5 is basically the same.

Fourth Exemplary Embodiment

Figure 5:
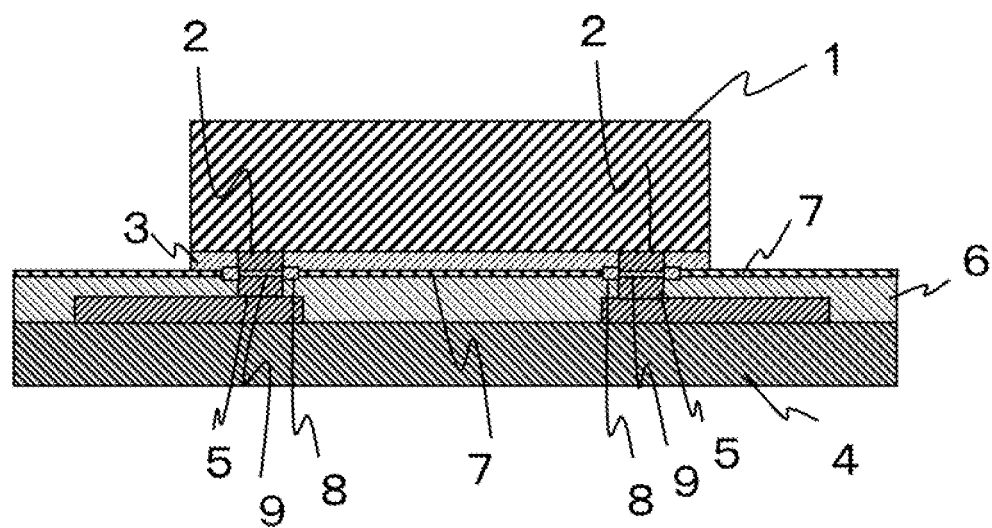
FIG. 5 is a cross section structural drawing of the semiconductor device according to another exemplary embodiment of the present invention.

Another exemplary embodiment of a semiconductor device according to the present invention is shown in FIG. 5. In the exemplary embodiment shown in FIGS. 1 and 2, voids are present as they are formed in areas surrounding electrodes 2 and 5 by laser radiation, but since bonding is performed by a bonding layer 7 formed on the whole surface of an LSI chip 1, there is no problem with strength. However, in a case where there is a concern that these voids expand by being exposed to reflow temperature at a time of secondary mounting due to moisture absorption or the like, leading to a decrease in reliability, as shown in FIG. 5 before implementation, a (reinforcing) resin 8 may be supplied to indentations (voids). At this time, by selecting a resin of high stiffness so as to reinforce a connection part as the reinforcing resin 8, it is possible to further improve connection reliability.

Fifth Exemplary Embodiment

Figure 3:
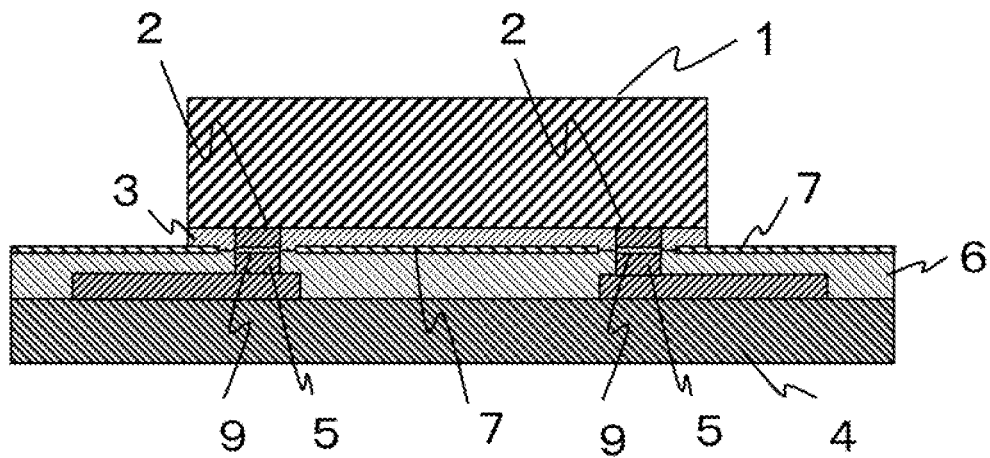
FIG. 3 is a cross section drawing showing an exemplary embodiment of the semiconductor device of the present invention in a case of using an inorganic film as an insulating layer.
Figure 4:
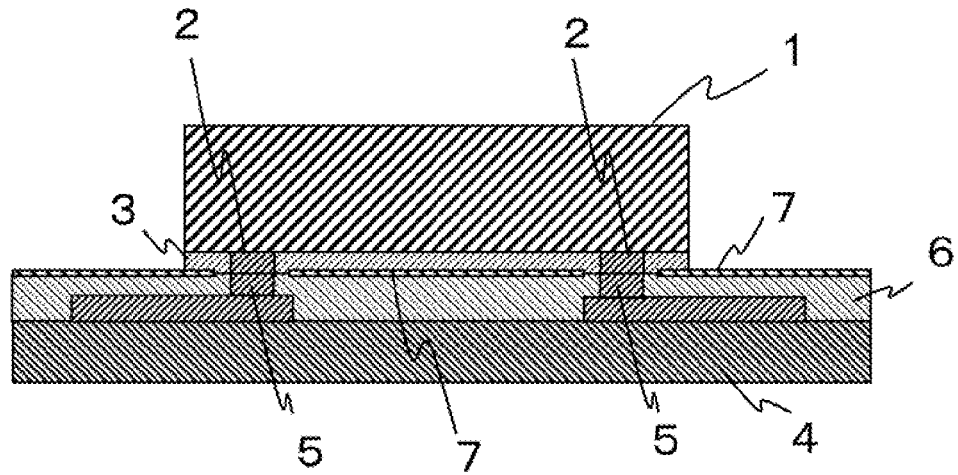
FIG. 4 is a cross section drawing showing another exemplary embodiment of the semiconductor device of the present invention in a case of using an inorganic film as an insulating layer.

FIG. 3 and FIG. 4 show structures in a case of using an inorganic film such as a silicon oxide film, a silicon nitride film, or the like, for insulating layers 3 and 6. In FIG. 3, similar to the structure shown in the first exemplary embodiment (FIG. 1), a Cu layer is formed on surfaces of insulating layers 3 and 6, with the exception of areas surrounding electrodes 2 and 5, and in addition an Au layer is formed on surfaces of the Cu layer and the electrodes 2 and 5, to perform bonding. Different from FIG. 1, an insulating layer in the areas surrounding the electrodes is not processed, and indentations (voids) are not formed. However, a bonding layer 7 is not formed on the insulating layers 3 and 6 in the areas surrounding the electrodes 2 and 5, and bonding is not performed.

It is to be noted that when a catalyst layer is removed, it is possible to sublimate or oxidize only a catalyst on the surfaces of the insulating layers 3 and 6 in the areas surrounding the electrodes 2 and 5, by controlling laser radiation range, so that electroless plating is not grown. In this case, the catalyst remains on the electrodes and it is possible to newly form a Cu layer the same as an insulating layer thereupon (not shown in the drawings).

FIG. 4 is a structure similar to a structure shown in the second exemplary embodiment (FIG. 2), using an inorganic film for the insulating layers 3 and 6, in which bonding is performed by the Cu layer only, without forming an Au layer. In any case, indentations are not formed in the areas surrounding the electrodes 2 and 5, the bonding layer 7 is not formed on the insulating layers 3 and 6 in the areas surrounding the electrodes 2 and 5, and bonding is not performed.

Sixth Exemplary Embodiment

In the abovementioned exemplary embodiments, surfaces of electrode of each of a chip and a substrate are assumed to be Cu plated. This is a metal wherein a bonding part can be formed as in the abovementioned exemplary embodiment 1 or electrodes can be directly bonded as in the second exemplary embodiment. However, in a case where an electrode surface is not a metal material suitable for the bonding part as in the abovementioned Cu, Ni, Pd, Sn, Au, and In, a bonding layer may be formed on the electrode surfaces similar to a bonding layer formed on an insulating layer.

Figure 8:
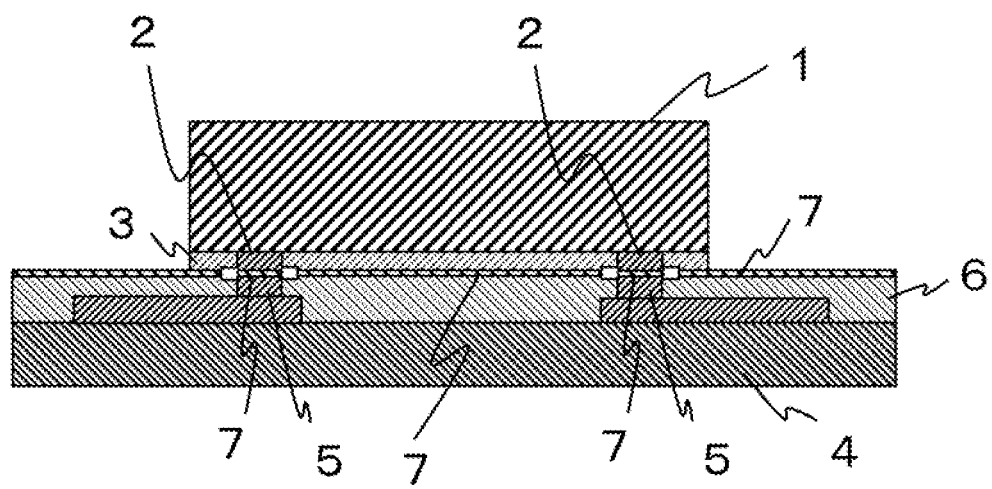
FIG. 8 is a cross section structural drawing of the semiconductor device according to the present invention in a case of also forming a bonding layer on an electrode surface.
Figure 9:
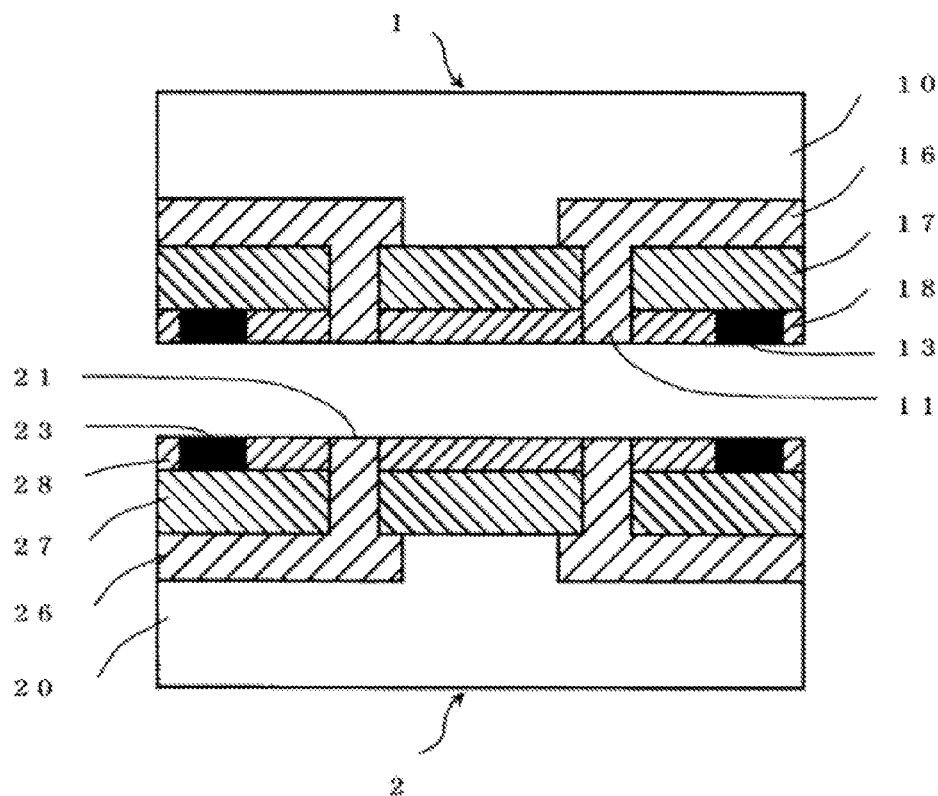
FIG. 9 is a cross section drawing of a semiconductor device showing conventional technology.
Figure 10:
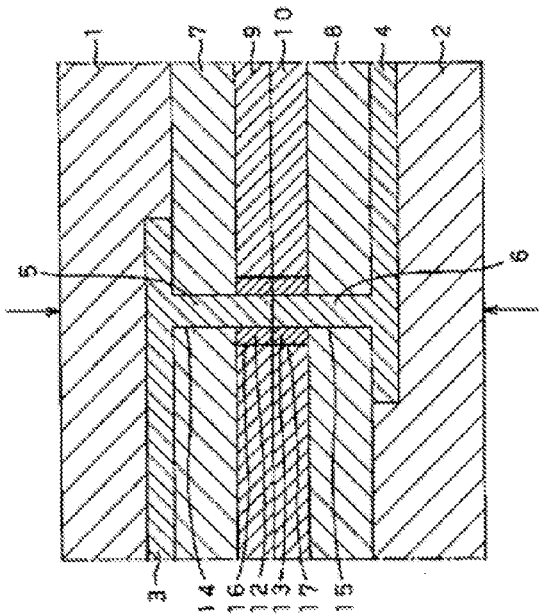
FIG. 10 is a cross section drawing of a semiconductor device showing conventional technology.
Figure 10:
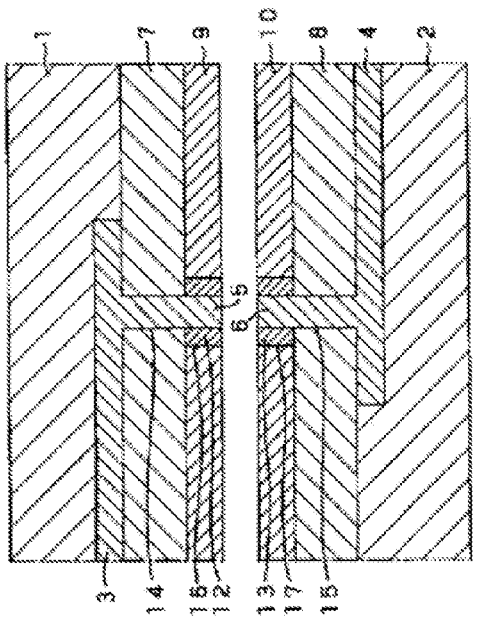

That is, in the first exemplary embodiment for example, Pd adhered to the electrode surfaces is not removed but is left, and only Pd of an insulating layer surface in an area surrounding the electrode is removed by laser radiation or the like. This is possible by controlling the range of laser radiation. After this, electroless Cu plating processing is performed, Cu is precipitated also on the electrode surface to which a Pd catalyst is adhered, and furthermore, an Au layer is precipitated by electroless plating on the insulating layer surface excepting the area surrounding the electrode, and the electrode surface, thereafter it is possible to bond at the same time the electrodes and the insulating layers by heating or pressurization processing. FIG. 8 shows a structural drawing thereof.

In the abovementioned method of manufacturing, a method by laser radiation was shown as a method of removing unnecessary portions of catalyst, but other physical means are also possible. Furthermore, a method is also possible of selectively supplying a catalyst only to a region where a catalyst is necessary from the start, by a method such as pre-patterning or the like.

Furthermore, in a process of supplying the catalyst before formation of a bonding layer 7, adhesion is improved by increasing surface reformation, that is surface roughness, by ashing or the like in order to improve adherence of the catalyst and to grow electroless plating uniformly.

In the abovementioned exemplary embodiments, as a method of supplying the bonding layer 7, a method by electroless plating was shown, but supplying may be performed by a method such as sputtering, vapor deposition, or the like. In this case, it is necessary to remove plating in the areas surrounding the electrodes 2 and 5 by a formation method using a mask or a method such as etching or the like.

Furthermore, the bonding layer 7 can have an effect of shielding electromagnetic noise radiated from wiring of an LSI chip 1 or a substrate 4 so as not to affect other wiring, and in this case film thickness is desirably 0.05 µm or more. However, due to the appearance of variations in crystal growth of the electroless plating when thickness is increased, since an effect of flattening the insulating layers recedes, it is preferable to have a maximum of approximately 3 µm. In an exemplary embodiment using Au, bonding was possible with even a layer thickness of 0.05-0.1 µm.

Furthermore, it is desirable that the bonding layer 7 be formed uniformly on the whole surface, but openings may be provided or a net form is possible; loading acting on a bond can be curtailed, and in a case of application to an LSI chip 1 of a large scale, this leads to lower costs of manufacturing devices.

Descriptions have been given above according to the abovementioned exemplary embodiments of the present invention, but the present invention is not limited to only configurations of the abovementioned exemplary embodiments, and clearly includes every type of transformation and modification that a person skilled in the art can realize within the scope of the present invention.

What is claimed is:

1. A semiconductor device wherein at least one LSI chip having an insulating layer surface and an electrode surface on one side and a substrate having an insulating layer surface and an electrode surface on one side are bonded by having said electrode surfaces and said insulating layer surfaces face each other, via a bonding layer made in a thin film form in a region excepting said electrode surfaces and said insulating layer surfaces in areas surrounding said electrodes,
   wherein said bonding layer is a metal bonding layer including at least one of any of the elements: Cu, Ni, Pd, Sn, Au, and In, or a combination of a plurality thereof.

2. The semiconductor device according to claim 1, wherein said bonding layer in said thin film form is formed also on a bonding surface of said electrode surfaces.

3. The semiconductor device according to claim 1, wherein said bonding layer is a thin film form bonding layer formed on a single flat surface.

4. The semiconductor device according to claim 1, wherein said bonding layer has a thickness of greater than or equal to 0.05 µm and less than or equal to 3 µm.

5. The semiconductor device according to claim 1, wherein voids are formed in a portion of the insulating layer surface in an area surrounding said electrode of said LSI chip and in a portion of the insulating layer surface in an area surrounding said electrode of said substrate.

6. The semiconductor device according to claim 1, wherein a resin is filled into the portion of the insulating layer surface in the area surrounding of said electrode of said LSI chip and into the portion of the insulating layer surface in the area surrounding said electrode of said substrate.

7. The semiconductor device according to claim 1, wherein said insulating layer surface of said LSI chip or said substrate is formed of an organic film.

8. The semiconductor device according to claim 7, wherein the insulating layer of said LSI chip or said substrate is formed of one or more among polyimide, modified polyimide, and epoxy.

9. The semiconductor device according to claim 1, wherein the insulating layer of said LSI chip or said substrate is formed of an inorganic film.

10. The semiconductor device according to claim 9, wherein the insulating layer of said LSI chip or said substrate is formed of one or more among silicon oxide film and silicon nitride film.

11. The semiconductor device according to claim 1, wherein said bonding layer is a structure partially having openings.

12. A method of manufacturing a semiconductor device comprising:
flattening an electrode and an insulating layer of each of an LSI chip and a substrate,
disposing a catalyst in order to form an electroless plating on surfaces of said flattened electrode and insulating layer,
removing only said catalyst disposed on said electrode and said insulating layer surface in an area surrounding said electrode,
forming a bonding layer of a thin film form on said insulating layer surfaces and said electrodes by processing of said electroless plating,
arranging positions of said electrodes of each of said LSI chip and said substrate, and
heating and pressurizing,
wherein said bonding layer is a metal bonding layer including at least one of any of the elements: Cu, Ni, Pd, Sn, Au, and In, or a combination of a plurality thereof.

13. A method of manufacturing a semiconductor device comprising:
flattening an electrode and an insulating layer of each of an LSI chip and a substrate;
disposing a catalyst in order to form an electroless plating on surfaces of said flattened electrode and insulating layer;
removing only said catalyst disposed on said electrode and said insulating layer surface in an area surrounding said electrode;
forming a bonding layer of a thin film form on said insulating layer surfaces by processing of said electroless plating,
arranging positions of said electrodes of each of said LSI chip and said substrate; and
heating and pressurizing,
wherein said bonding layer is a metal bonding layer including at least one of any of the elements: Cu, Ni, Pd, Sn, Au, and In, or a combination of a plurality thereof.

14. The method of manufacturing said semiconductor device according to claim 12, further comprising:
performing surface reformation on an upper surface of said flattened electrode and insulating layer, before said disposing said catalyst in order to form said electroless plating.

15. The method of manufacturing said semiconductor device according to claim 13, further comprising:
performing surface reformation on an upper surface of said flattened electrode and insulating layer, before said disposing said catalyst in order to form said electroless plating.

* * * * *